(12) United States Patent
Elian et al.

(10) Patent No.: US 7,220,531 B2
(45) Date of Patent: May 22, 2007

(54) RESIST FOR ELECTRON BEAM LITHOGRAPHY AND A PROCESS FOR PRODUCING PHOTOMASKS USING ELECTRON BEAM LITHOGRAPHY

(75) Inventors: Klaus Elian, Erlangen (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 374 days.

(21) Appl. No.: 10/376,904

(22) Filed: Feb. 28, 2003

(65) Prior Publication Data

US 2003/0165752 A1    Sep. 4, 2003

(30) Foreign Application Priority Data

Feb. 28, 2002  (DE)  ................ 102 08 785

(51) Int. Cl.
*G03F 7/004* (2006.01)
*G03F 7/20* (2006.01)
*G03F 7/40* (2006.01)

(52) U.S. Cl. .............. 430/270.1; 430/5; 430/296; 430/286.1; 430/942

(58) Field of Classification Search .............. 430/5, 430/296, 270.1, 286.1
See application file for complete search history.

(56) References Cited

U.S. PATENT DOCUMENTS 3,914,462 A     10/1975  Morishita
5,234,793 A *   8/1993   Sebald et al. ............... 430/323
5,234,794 A     8/1993   Sebald et al.
5,939,574 A *   8/1999   Schilling et al. ............ 556/425
6,280,908 B1*   8/2001   Aviram et al. .............. 430/314
6,296,984 B1*   10/2001  Gabor et al. ............. 430/270.1
6,358,670 B1*   3/2002   Wong et al. ................ 430/296
6,387,573 B1*   5/2002   Park et al. ..................... 430/5
6,482,558 B1*   11/2002  Singh et al. .................. 430/30
RE37,996 E *    2/2003   Mizuno et al. ............. 430/313
6,562,555 B2*   5/2003   Fiebag et al. ............... 430/399
6,660,455 B2*   12/2003  Itoh et al. ................... 430/311
6,703,171 B2*   3/2004   Hattori et al. ................. 430/5
6,753,129 B2*   6/2004   Livesay et al. ............. 430/296
6,770,423 B2*   8/2004   Rottstegge et al. ......... 430/311
6,800,407 B2*   10/2004  Czech et al. .................. 430/30
2003/0165751 A1* 9/2003  Elian et al. ..................... 430/5
2004/0043330 A1* 3/2004  Rottstegge et al. ......... 430/311

FOREIGN PATENT DOCUMENTS

DE       22 27 008 B2    12/1972
DE       102 08 448 A1    9/2003
EP       0395 917 A2     11/1990

* cited by examiner

*Primary Examiner*—Amanda Walke
(74) *Attorney, Agent, or Firm*—Laurence A. Greenberg; Werner H. Stemer; Ralph E. Locher

(57) ABSTRACT

The invention relates to a resist for electron beam lithography and to a process for producing photomasks for optical lithography. The inventive resist includes repeating units that are derived from maleic anhydride and that can act as an anchor group for the subsequent binding of silicon-containing groups. The etch stability of the resist can thus be subsequently increased so that there is no dimensional loss on transfer of the resist structure to a chromium layer arranged under the resist.

18 Claims, No Drawings

RESIST FOR ELECTRON BEAM LITHOGRAPHY AND A PROCESS FOR PRODUCING PHOTOMASKS USING ELECTRON BEAM LITHOGRAPHY

BACKGROUND OF THE INVENTION

Field of the Invention

The invention relates to a resist for electron beam lithography and a process for producing photomasks for optical lithography.

In the production of microchips, lithographic processes are used for structuring semiconductor substrates. In general, silicon wafers into which structures or components may already have been introduced serve as a semiconductor substrate. First, a thin layer of photoresist is applied to the semiconductor substrate. The chemical or physical properties of the photoresist can be changed by being exposed to light. The photoresist is exposed to light, which is in general monochromatic light. In particular, laser light is used. A photomask that contains all of the information regarding the structure to be imaged is introduced into the beam path between the radiation source and the photoresist. In the simplest case, the structure contained in the photomask corresponds to an image of the structure to be produced on the semiconductor substrate, which image has been magnified by about five times. This structure is projected using a corresponding optical system onto the photoresist so that the photoresist is exposed section by section and, for example, a chemical modification of the photoresist is produced in the exposed sections. The exposed photoresist is developed with a developer, and only the exposed parts are selectively removed. The remaining unexposed resist sections then serve as a mask for processing the semiconductor substrate. The structure predetermined by the resist mask can be transferred into the semiconductor substrate, for example, by dry etching with an etching plasma, in order, for example, to produce trenches for trench capacitors. However, the resist structures may also be filled with a further material, for example, polysilicon, in order to produce conductor tracks.

The photomask arranged in the beam path is produced by writing on a substrate using an electron beam. For this purpose, a layer of a mask material for producing exposed and unexposed sections on the photoresist is first applied to a transparent substrate, generally a quartz glass. In the case of COG masks (COG="chrome on glass") as the simplest example of a photomask, the mask material consists of a thin chromium layer. In order to be able to structure the layer of the mask material, for example, the chromium layer, a layer of a photoresist is first applied to the chromium layer. The properties of the photoresist can be changed by irradiation. At present, a layer of polymethyl methacrylate (PMMA) is usually used as a photoresist layer. This photoresist layer is then written on using a mask writer with an electron beam. Those parts in which the chromium layer is to be removed in a subsequent operation in order to obtain transparent sections of the mask are exposed to the electron beam. The polymethyl methacrylate is cleaved into smaller fragments by the energy of the electron beam. The different solubility of the PMMA and the fragments formed from the PMMA by exposure in a solvent is utilized for developing the exposed photoresist. For this purpose, a developer is added to the exposed photoresist. The developer is generally an organic solvent that selectively dissolves only the fragments formed from the PMMA in the exposed parts, while the PMMA remains unchanged on the chromium layer in the unexposed parts. Using an etching plasma, the structure formed from the photoresist is now transferred into the chromium layer arranged underneath. For this purpose, an oxygen/chlorine gas mixture is used in order to form volatile chromium compounds and to remove the chromium layer in the bare sections and to bare the transparent quartz substrate arranged under the chromium layer.

However, the currently used photoresists are very strongly attacked by the oxygen component contained in the etching plasma, so that the photoresist is removed at the edges of the structure produced from the photoresist, and the chromium layer arranged underneath is no longer protected. This results in a considerable lateral structure loss at the chromium edges. Conventional metrology losses in chromium are about 50 nm per edge. After the etching process, the absorber lines produced from the chromium layer may therefore be up to 100 nm narrower than the width defined by the photoresist. This structure loss was already taken into account in the mask layout and a corresponding structure reserve was provided. The absorber lines to be produced from the chromium layer were thus simply broadened in the mask layout. For structure dimensions of more than 0.25 µm, as occur in the case of photomasks currently used for producing microchips, this presents no difficulties at all. With decreasing dimensions of the structures being produced in the semiconductor substrate, however, the size of the absorber structures contained in the photomask also decreases. Furthermore, diffraction and interference effects that adversely affect the resolution of the photomask occur in imaging very small structures. In order to improve the resolution, nonimaging elements are therefore added to the structural elements in the photomask that are to be imaged, in order thus to achieve a steeper transition between the exposed and the unexposed sections on the photoresist. The nonimaging structures of the photomask have a line width that is below the resolution of the imaging apparatus and which, in particular, is determined by the wavelength of the radiation used for the exposure. This method for improving the imaging by introducing nonimaging structural elements in the photomask is also referred to as OPC (optical proximity correction). By this measure, the structure reproduced and the structure of the photomask are no longer similar. The photomask thus also contains auxiliary structures in addition to the structures to be reproduced. In the production of the photomask, a substantially larger number of structural elements than corresponds to the reproduced structure must therefore be produced. If the reduction in the dimensions of the photomask that is due to the reduction in the size of the structures to be produced in the semiconductor substrate is taken into account, it is directly evident that the latitude available for a structure reserve in the production of the photomask decreases continuously or is no longer present. The nonimaging auxiliary structures of the photomask will reach dimensions down to 100 nm or less in the near future and will have to be arranged at a defined distance away from the main structures of the mask. In the case of these very fine structural dimensions, a prior correction of the layout, i.e. a structure reserve, is no longer possible since, in the case of a required distance of 100 nm and a simultaneous structure reserve of in each case 50 nm per edge, the structures would collapse into a single line in the layout itself. There is at present no photoresist with which a line spacing of 50 nm can be resolved in the chromium mask.

SUMMARY OF THE INVENTION

It is accordingly an object of the invention to provide a resist for-electron beam lithography and a process for producing photomasks, which overcome the above-mentioned disadvantages of the prior art apparatus and methods of this general type.

In particular, it is an object of the invention to provide a resist for electron beam lithography, which resist permits the transfer of a structure produced from the resist into a mask material arranged under the resist with a very small structural loss or ideally without any structure loss.

With the foregoing and other objects in view there is provided, in accordance with the invention, a resist for electron beam lithography. The resist includes: a film-forming polymer obtained by copolymerization of a comonomer mixture, the comonomer mixture including at least one first comonomer having a polymerizable carbon-carbon double bond and an anchor group, the comonomer mixture including at least one further comonomer; and a solvent or a solvent mixture.

In accordance with an added feature of the invention, the first comonomer is an at least monounsaturated carboxylic anhydride.

In accordance with an additional feature of the invention, the at least monounsaturated carboxylic anhydride is maleic anhydride.

In accordance with another feature of the invention, the further comonomer is selected from a group consisting of alkyl esters of (meth)acrylic acid.

In accordance with a further feature of the invention, the further comonomer is methyl methacrylate.

With the foregoing and other objects in view there is also provided, in accordance with the invention, a process for producing a photomask for optical lithography. The process includes steps of: providing a transparent substrate; depositing a first layer of a mask material on the transparent substrate; providing a resist including a film-forming polymer obtained by copolymerization of a comonomer mixture, the comonomer mixture including at least one first comonomer having a polymerizable carbon-carbon double bond and an anchor group, the comonomer mixture including at least one further comonomer, the resist including a solvent or a solvent mixture; applying a layer of the resist to the first layer and evaporating the solvent in the resist to obtain a second layer of the film-forming polymer contained in the resist; producing an image including exposed parts and unexposed parts in the second layer by writing on the second layer using a focused electron beam; adding a developer to the second layer to dissolve the exposed parts of the image and to obtain a structured resist in which the unexposed parts of the image form lands and the exposed parts of the image form trenches configured between the lands; adding an amplification agent to the structured resist, the amplification agent including a group for coordinating to the anchor group of the polymer; obtaining an amplified structure by leaving the amplification agent on the structured resist for a time required to bound the amplification agent to the polymer; and transferring the amplified structure to the first layer.

In accordance with an added mode of the invention, the process includes removing the developer, after performing the step of adding the developer to the second layer to dissolve the exposed parts of the image and to obtain the structured resist.

In accordance with an additional mode of the invention, the process includes removing excess amplification agent, after performing the step of obtaining the amplified structure.

In accordance with another mode of the invention, the process includes providing the amplification agent as a solution.

In accordance with a further mode of the invention, the process includes providing the amplification agent as a solution in the developer.

In accordance with a further added mode of the invention, the amplification agent includes at least one silicon-containing group.

In accordance with another added mode of the invention, the amplification agent includes at least two groups that coordinate to anchor groups of the film-forming polymer.

In accordance with yet an added mode of the invention, the mask material is provided as chromium.

In accordance with yet an additional mode of the invention, the step of transferring the amplified structure to the first layer includes transferring the amplified structure by plasma etching to the first layer.

The inventive resist for electron beam lithography differs from the resists used to date for electron beam lithography in that the film-forming polymer contained in the resist has anchor groups that are introduced via an additional comonomer that contains a polymerizable carbon-carbon double bond and an anchor group. An anchor group is understood as meaning a functional group that can be nucleophilically attacked by a nucleophilic group with the formation of a covalent bond, so that groups can be introduced subsequently into the film-forming polymer. As a result of the introduction of silicon-containing groups, the etch stability of a structure produced from the resist in an oxygen plasma can be increased subsequently. The silicon of the silicon-containing groups is converted by the oxygen component of the etching plasma into silicon dioxide, which forms a nonvolatile layer on the resist structure. In contrast to the resist systems used to date, which are converted into volatile compounds by the oxygen component of the etching plasma and thus suffer a structure loss, the etch stability of the inventive resist can be subsequently modified. The inventive resist can be used in the same way as the resists known to date for electron beam lithography, which are used for the production of photomasks. The knowledge accumulated from photomask production can therefore be directly applied to the inventive resist.

As already mentioned, the polymer of the inventive resist differs from the resists used to date for producing photomasks by the additional introduction of an anchor group. All comonomers customary for the preparation of polymers for resists for electron beam lithography for the production of photomasks can therefore be used as further comonomers for the preparation of the film-forming polymer. These comonomers contain no functional groups that permit subsequent modification of the film-forming polymer, for example, no groups cleavable by acid, as is customary for polymers which are contained in chemically amplified photoresists that are exposed using the photomask.

For example, methoxypropyl acetate, cyclopentanone and cyclohexanone, γ-butyrolactone, ethyl lactate, diethylene glycol, dimethyl ether or a mixture of at least two of these solvents can be used as a solvent for the resist. In general, however, all conventional solvents or mixtures thereof which are capable of taking up the film-forming polymer to give a clear, homogeneous solution having a long shelf life and which ensure a good layer quality on coating of the substrate can be used.

The polymer of the inventive resist contains an anchor group which enables subsequent introduction of groups for increasing the etch resistance. These anchor groups must have sufficient reactivity to be able to undergo, within periods suitable for an industrial application, a sufficient reaction with an amplification reagent by means of which the groups for increasing the etch resistance are introduced into the polymer. Groups which have sufficient reactivity for use as an anchor group are, for example, isocyanates, epoxides, ketenes, oxiranes, urethanes or acid anhydrides. Carboxylic anhydride groups have proven particularly advantageous since, on the one hand, they have sufficient stability to permit uncomplicated preparation and processing of the polymer or of the resist and, on the other hand, have sufficiently high reactivity to undergo a reaction with an amplification agent within periods of interest for an industrial application. The first comonomer is therefore particularly preferably an at least monounsaturated carboxylic anhydride. Here, at least monounsaturated is understood as meaning that the carboxylic anhydride has at least one polymerizable carbon-carbon double bond. Suitable first comonomers are, for example, cyclohexenedicarboxylic anhydride, itaconic anhydride, norbornenedicarboxylic anhydride or methacrylic anhydride. A particularly suitable at least monounsaturated carboxylic anhydride is maleic anhydride. Maleic anhydride can be readily introduced as a comonomer into the polymer during the preparation of the film-forming polymer by free radical polymerization. The repeating units derived from maleic anhydride have sufficient reactivity for a reaction with an amplification agent in order to permit industrial use. Furthermore, maleic anhydride can be economically obtained.

As already mentioned, essentially all comonomers which are already used for the preparation of polymers for resists for electron beam lithography can be used as further comonomers. Such monomers are, for example, methacrylic acid, styrene, p-hydroxystyrene or allylsilane.

Owing to their high reactivity, alkyl esters of (meth) acrylic acid are particularly suitable since they can be readily copolymerized with monounsaturated carboxylic anhydrides, in particular maleic anhydride. The alkyl group of the alkyl esters preferably includes 1 to 10 carbon atoms. A particularly preferably used further comonomer is methyl (meth)acrylate.

The film-forming polymer contained in the inventive resist is prepared by free radical copolymerization of the first and of the further comonomers by customary processes. The free radical polymerization can be carried out in solution or in a solvent-free system. Customary free radical initiators, for example benzoyl peroxide or azobisisobutyronitrile (AIBN), can be used as free radical initiators for the free radical polymerization. For the production of the resist, the film-forming polymer is then dissolved in a suitable solvent.

The film-forming polymer is: 1–50% by weight, preferably 2–10% by weight; and the solvent is: 50–99% by weight, preferably 88–97% by weight.

Further components/additives that influence the resist system advantageously with respect to resolution, film formation properties, shelf life, radiation sensitivity and pot life effects may also be added to the resist. In addition to the polymer and the solvent, the resist may contain, for example, sensitizers or solubilizers.

The inventive resist for electron beam lithography permits subsequent modification of the chemical and physical properties of the resist, in particular, an increase in the etch resistance. The invention therefore also relates to a process for producing photomasks for optical lithography, wherein:

a transparent substrate is provided, a first layer of a mask material is deposited on the transparent substrate, a layer of the resist described above is applied to the first layer and the solvent contained in the resist is evaporated so that a second layer of the film-forming polymer contained in the resist is obtained, the second layer is written on by means of a focused electron beam so that an image which includes exposed and unexposed parts is produced in the second layer, a developer which dissolves the exposed parts of the image is added to the second layer to give a structured resist in which the unexposed parts of the image form lands and the exposed parts of the image form trenches arranged between the lands, if required, the developer is removed, an amplification agent which includes a group which can coordinate to the anchor groups of the polymer is added to the structured resist, the amplification agent is left on the structured resist for a certain time so that the amplification agent is bound to the polymer and an amplified structure is obtained, if required, excess amplification agent is removed, and the amplified structure is transferred to the first layer.

In carrying out the process according to the invention, a transparent substrate is first provided. The substrate is transparent to the exposure radiation and generally consists of quartz glass. A first layer of a mask material is then deposited onto the substrate. For the production of COG masks, for example, a chromium layer is deposited for this purpose. The deposition can be effected, for example, by sputtering. However, other materials, for example, semitransparent materials or phase-shift materials, may also be used as mask material. Exemplary materials are titanium or MoSi.

A layer of the above-described resist for electron beam lithography is then applied to the first layer. Customary methods can be used tor this purpose, for example, spin coating, spraying on or dip methods. In order to obtain a solid resist film, the solvent contained in the resist is then evaporated so that a second layer of the film-forming polymer contained in the resist is obtained. For this purpose, the substrate with the applied resist layer can, for example, be heated. The resist film is then written on using a focused electron beam to produce an image of the second layer, which image includes exposed and unexposed parts. As a result of writing with an electron beam, a certain mask layout is thus impressed into the second layer formed from the film-forming polymer. Using the energy of the electron beam, the polymer is cleaved into shorter fragments so that chemical differentiation between exposed and unexposed parts is effected. Customary mask writers can be used for writing on the resist film. A developer that dissolves the exposed parts of the image is then added to the second layer to give a structured resist in which the unexposed parts of the image form lands and the exposed parts of the image form trenches arranged between the lands. A developer suitable for use is an organic solvent that does not dissolve the film-forming polymer, but in which the fragments formed from the film-forming polymer are soluble. Suitable solvents are, for example, butyl lactate, γ-butyrolactone, methyl ethyl ketone, isopropanol or methyl isobutyl ketone. The solvents can be used alone or as a mixture of a plurality of solvents. For example, a 1:1 mixture of methyl ethyl ketone and isopropanol is suitable. Customary methods can be used for adding the developer, for example, puddle methods or dip methods. Excess developer can then be removed. An amplification agent that includes a group that can coordinate to the anchor groups of the polymer is then added to the structured resist. The amplification agent must have a certain nucleophilicity in order to be able to react with the anchor groups of the polymer. Suitable amplification agents are, for example, hydroxyl groups, thiol groups or particularly preferably amino groups. To permit linkage of the amplification agent, the amplification agent is left for a certain time on the structured resist so that the amplification agent is bound to the polymer and an amplified structure is obtained. The time required for the reaction of the amplification agent with the anchor groups of the film-forming polymer can be controlled, for example, by the concentration in which the amplification agent is applied to the structured resist or by the temperature at which the reaction is carried out. The reaction with the amplification agent is continued until the desired modification of the film-forming polymer is achieved. Excess amplification agent can be removed after the end of the reaction.

The amplified structure can then be transferred to the first layer including the mask material. For this purpose, the bare mask material in the bare sections is etched away. This is advantageously effected by dry etching with an etching plasma. However, wet etching methods can also be used. If a chromium layer is used as mask material, the removal of the bare chromium material by etching is effected, for example, with a plasma of a chlorine/oxygen gas mixture.

The amplification agent can be applied to the structured resist, for example, from the gas phase. However, the amplification agent is preferably applied in the form of a solution to the structured resist. The film-forming polymer in the structured resist may be swollen by the solvent, with the result that the amplification agent can also penetrate into deeper parts of the resist structure in order to react there with the anchor groups of the film-forming polymer. Furthermore, excess amplification agent can be very easily removed by centrifuging or washing.

Other features which are considered as characteristic for the invention are set forth in the appended claims.

Although the invention is illustrated and described herein as embodied in a resist and a process for producing a photomask using electron beam lithography, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In a particularly preferred embodiment of the inventive process, the amplification agent is applied as a solution in the developer to the exposed resist. In this embodiment, the development of the exposed resist and the amplification of the structured resist are effected simultaneously in one operation, with the result that production of the amplified structure can be simplified and shortened.

The inventive process permits a subsequent increase in the etch stability of the resist in an oxygen plasma. For this purpose, groups containing silicon are introduced into the polymer, which groups are converted into nonvolatile silicon dioxide in the oxygen plasma and form a protective layer on the mask material. For this purpose, the amplification agent preferably includes a silicon-containing group.

In a particularly preferred embodiment, the amplification agent includes at least two reactive groups. During the amplification, further crosslinking of the polymer is effected by the amplification agent, with the result that the stability of the resist structure increases and removal of the amplified resist by a solvent is substantially suppressed.

The amplification agent is preferably a silicon compound having basic functions, in particular, an aminosiloxane. Chain-like dimethylsiloxanes having terminal aminopropyl units and 2 to 51, but preferably 2 to 12, silicon atoms per molecule have proven particularly useful. Such a chain-like dimethylsiloxane is shown below with its general structural formula.

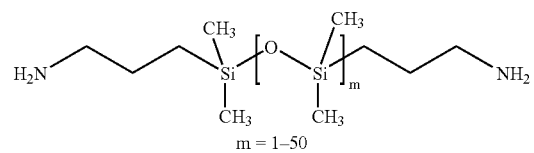

Further examples of amplification agents having amino-functional groups can be represented by the following general structural formula:

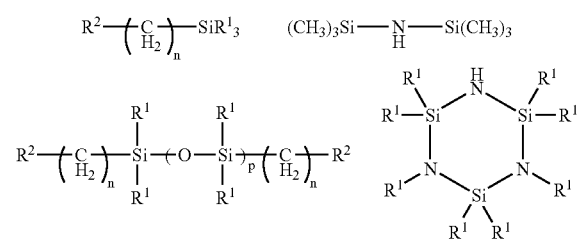

in which
p is an integer from 0 to 30,
n is an integer from 1 to 20,
$R^1$=H, alkyl or aryl,
and $R^2$=

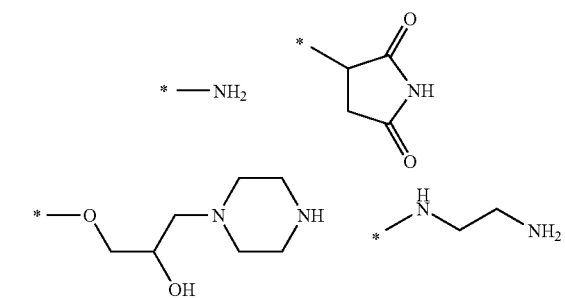

In addition to silicon-containing basic amplification agents, other basic compounds are also suitable for carrying out the inventive process. These compounds preferably contain aromatic groups since this increases the resistance of the amplified resist to an etching plasma. Some suitable amplification agents are shown below by way of example:

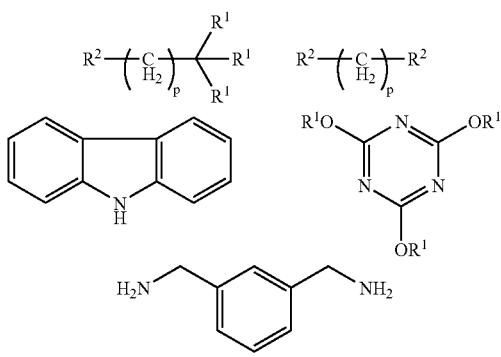

in which the radicals $R^1$ and $R^2$ independently of one another, have the abovementioned meaning and p=0 to 30.

The inventive process is particularly suitable for producing photomasks that include absorber structures. The mask material is therefore preferably chromium.

The invention is explained in more detail with reference to an example: 195 mmol of methyl methacrylate is dissolved in 105 mmol of maleic anhydride and 4.2 mmol of α,α'-azobisisobutyronitrile as a free radical initiator is dissolved in 60 ml of 2-butanone and heating is effected for 3 hours under reflux (80° C.). Thereafter, the reaction solution is cooled to room temperature and 27.5 ml of 2-propanol is added with vigorous stirring. The solution obtained is added dropwise in the course of 30 minutes with very vigorous mechanical stirring to a solution of 10.5 g (13.1 ml) of 2-butanone, 337.0 g (429 ml) of 2-propanol and 329.0 g (329.0 ml) of water. The polymer is precipitated as a fine white powder. Stirring is continued for a further 30 minutes and the solvent is then filtered off under slightly reduced pressure over a G3 frit. The white precipitate is washed with a solution of 16.0 g (20.0 ml) of 2-butanone, 111.0 g (141 ml) of 2-propanol and 100.0 g (100 ml) of water and dried for 72 hours at 80° C. in a high vacuum. About 40 g (80% of theory) of fine, white powder is obtained as a reaction product. A 3% strength by weight solution of this polymer in ethyl lactate is prepared, which solution serves below as prepared resist A.

Resist A is applied using a spin coater at 4000 rpm for 25 seconds to a quartz glass substrate with a sputtered-on chromium layer and then dried on a hotplate at 140° C. for 120 s. A test layout consisting of line/trench patterns of different dimensions (range 350 nm-100 nm) is written on the resist-coated quartz glass plate using different doses (range 50 μC/cm² to 500 μC/cm²) using a Jeol JSM840/Sietec nanobeam pattern generator at 40 keV. The inscribed sample is then placed for 240 s in a solution of 48% of butyl lactate, 48% of γ-butyrolactone and 4% of bis(aminopropyl) oligomethylsiloxane, then washed for 20 s with isopropanol and blown dry with nitrogen. A relief-like image of the structure in the resist is obtained. Finally, the sample is dry-etched with a gas mixture including 50% of oxygen and 50% of chlorine in an ECR-ignited plasma. The chromium in the parts unprotected by the resist is thereby converted into readily volatile components and is removed from the glass plate. The chromium parts protected by the resist are preserved and, after the etching process, have the same metrology as intended in the original write layout.

We claim:

1. A process for producing a photomask for optical lithography, the process which comprises:
    providing a transparent substrate;
    depositing a first layer of a mask material on the transparent substrate;
    providing a resist including a film-forming polymer obtained by copolymerization of a comonomer mixture, the comonomer mixture including at least one first comonomer having a polymerizable carbon-carbon double bond and an anchor group, the comonomer mixture including at least one further comonomer, the resist including a solvent or a solvent mixture;
    applying a layer of the resist to the first layer and evaporating the solvent in the resist to obtain a second layer of the film-forming polymer contained in the resist;
    producing an image including exposed parts and unexposed parts in the second layer by writing on the second layer using a focused electron beam;
    adding a developer to the second layer to dissolve the exposed parts of the image and to obtain a structured resist in which the unexposed parts of the image form lands and the exposed parts of the image form trenches configured between the lands;
    adding an amplification agent to the structured resist, the amplification agent including a group for coordinating to the anchor group of the polymer;
    obtaining an amplified structure by leaving the amplification agent on the structured resist for a time required to bound the amplification agent to the polymer; and
    transferring the amplified structure to the first layer, the amplification agent being provided as a solution in the developer.

2. The process according to claim 1, which comprises removing the developer, after performing the step of adding the developer to the second layer to dissolve the exposed parts of the image and to obtain the structured resist.

3. The process according to claim 1, which comprises removing excess amplification agent, after performing the step of obtaining the amplified structure.

4. The process according to claim 1, which comprises providing the amplification agent as a solution.

5. The process according to claim 1, which comprises providing the amplification agent as a solution in the developer.

6. The process according to claim 1, wherein the amplification agent includes at least one silicon-containing group.

7. The process according to claim 1, wherein the amplification agent includes at least two groups that coordinate to anchor groups of the film-forming polymer.

8. The process according to claim 1, which comprises providing the mask material as chromium.

9. The process according to claim 1, wherein the step of transferring the amplified structure to the first layer includes transferring the amplified structure by plasma etching to the first layer.

10. A photomask for electron beam lithography obtained by using the method according to claim 1.

11. The photomask of claim 10, wherein said first comonomer is maleic anhydride and said further comonomer is methyl methacrylate.

12. The photomask of claim 10, further comprising a reaction product of said copolymer with an amplification agent.

13. The photomask of claim 12, wherein said amplification agent is an aminosiloxane represented by the formula

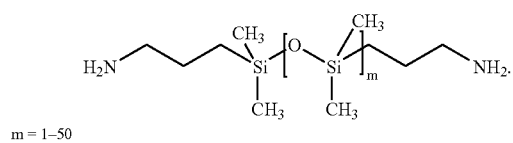

m = 1–50

14. A resist for electron beam lithography provided on a photomask according to claim 1.

15. The resist according to claim 14, wherein said first comonomer is an at least monounsaturated carboxylic anhydride.

16. The resist according to claim 15, wherein said at least monounsaturated carboxylic anhydride is maleic anhydride.

17. The resist according to claim 14, wherein said further comonomer is selected from a group consisting of alkyl esters of (meth)acrylic acid.

18. The resist according to claim 14, wherein said further comonomer is methyl methacrylate.

* * * * *